United States Patent
Tanielian

(10) Patent No.: US 7,557,487 B2
(45) Date of Patent: Jul. 7, 2009

(54) METHODS AND APPARATUS FOR THERMAL ISOLATION FOR THERMOELECTRIC DEVICES

(75) Inventor: Minas H. Tanielian, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 229 days.

(21) Appl. No.: 11/044,154

(22) Filed: Jan. 26, 2005

(65) Prior Publication Data

US 2006/0162761 A1 Jul. 27, 2006

(51) Int. Cl.
H02N 10/00 (2006.01)
(52) U.S. Cl. .................................................. 310/306
(58) Field of Classification Search ................ 322/2 R; 310/306, 307; 136/200, 201, 202, 205; 257/467
See application file for complete search history.

(56) References Cited

U.S. PATENT DOCUMENTS

| | | | | |
|---|---|---|---|---|
| 3,376,437 A * | 4/1968 | Meyerand, Jr. et al. | ...... | 310/306 |
| 3,515,908 A * | 6/1970 | French | ........................ | 310/306 |
| 3,578,992 A | 5/1971 | Paine et al. | ..................... | 310/4 |
| 4,771,201 A | 9/1988 | Free | ............................ | 310/306 |
| 5,675,972 A | 10/1997 | Edelson | ........................ | 62/3.1 |
| 5,699,668 A | 12/1997 | Cox | ............................... | 62/3.1 |
| 5,722,242 A | 3/1998 | Edelson | ........................ | 62/3.1 |
| 5,810,980 A | 9/1998 | Edelson | .................. | 204/290 R |
| 5,874,039 A | 2/1999 | Edelson | .................. | 204/290 R |
| 5,981,071 A | 11/1999 | Cox | ............................. | 428/408 |
| 5,994,638 A | 11/1999 | Edelson | | |
| 6,064,137 A | 5/2000 | Cox | ........................... | 310/306 |
| 6,089,311 A | 7/2000 | Edelson | ................. | 165/104.23 |
| 6,103,298 A | 8/2000 | Edelson et al. | ................. | 427/77 |
| 6,117,344 A | 9/2000 | Cox et al. | ..................... | 216/11 |
| 6,214,651 B1 | 4/2001 | Cox | ........................... | 438/141 |
| 6,229,083 B1 * | 5/2001 | Edelson | ....................... | 136/201 |
| 6,281,139 B1 | 8/2001 | Tavkhelidze et al. | ........ | 438/763 |
| 6,281,514 B1 | 8/2001 | Tavkhelidze | ............. | 250/493.1 |
| 6,417,060 B2 * | 7/2002 | Tavkhelidze et al. | ........ | 438/380 |
| 6,495,843 B1 | 12/2002 | Tavkelidze | ............... | 250/493.1 |

(Continued)

FOREIGN PATENT DOCUMENTS

DE  3818192 A1  12/1989

(Continued)

OTHER PUBLICATIONS

Huffman et al., "Preliminary Investigations of a Thermotunnel Converter", (Jul. 31-Aug. 5, 1988), 23rd Intersociety Energy Conversion Engineering Conference, vol. 1, pp. 573-579.*

(Continued)

Primary Examiner—Karl I Tamai

(57) ABSTRACT

Methods and apparatus for improved thermal isolation for thermoelectric devices are disclosed. In one embodiment, a thermoelectric device includes a first substrate having a first conductive pad, a second substrate having a second conductive pad, and a gap formed between the first and second conductive pads. At least one of the first and second substrates includes at least one opening positioned adjacent to an outer peripheral edge of the conductive pad. The opening may comprise a trench disposed partially or entirely around the outer peripheral edge of the conductive pad. In operation, the opening inhibits heat transfer between the first and second substrates.

11 Claims, 4 Drawing Sheets

U.S. PATENT DOCUMENTS

| | | | |
|---|---|---|---|
| 6,509,669 B1 * | 1/2003 | King et al. | 310/306 |
| 6,531,703 B1 | 3/2003 | Tavkhelidze | 250/493.1 |
| 6,651,760 B2 | 11/2003 | Cox et al. | 180/65.3 |
| 6,680,214 B1 | 1/2004 | Tavkhelidze et al. | 438/20 |
| 6,720,704 B1 | 4/2004 | Tavkhelidze et al. | 310/306 |
| 6,774,003 B2 | 8/2004 | Tavkhelidze et al. | 438/380 |
| 2003/0042819 A1 | 3/2003 | Martinovsky et al. | 310/306 |
| 2003/0111516 A1 | 6/2003 | Ghoshal | 228/134 |
| 2004/0195934 A1 * | 10/2004 | Tanielian | 310/306 |
| 2006/0162761 A1 * | 7/2006 | Tanielian | 136/205 |

FOREIGN PATENT DOCUMENTS

| | | | |
|---|---|---|---|
| WO | WO9826880 | | 6/1998 |
| WO | WO99/13562 | * | 3/1999 |

OTHER PUBLICATIONS

Hishinuma, et al., "Refrigeration by Combined Tunneling and Thermionic Emission in Vaccum; Use of Nanometer Scale Design", Applied Physics Letters, vol. 78, No. 17, pp. 2572-2573, Apr. 2001.

PCT Intl Search Report and Written Opinion for Application No. PCT/US2006/001611, dated Mar. 30, 2007, 11 pages.

* cited by examiner

METHODS AND APPARATUS FOR THERMAL ISOLATION FOR THERMOELECTRIC DEVICES

GOVERNMENT LICENSE RIGHTS

This invention was made with U.S. Government support under U.S. Government Contract MDA972-03-2-0003 awarded by the Defense Advanced Research Projects Agency. The U.S. Government has certain rights in this invention.

FIELD OF THE INVENTION

This invention relates to thermoelectric devices, and more specifically, to improved thermal isolation for thermoelectric devices.

BACKGROUND OF THE INVENTION

Thermoelectric devices convert temperature gradients into electricity and vice versa. Examples of thermoelectric devices include, but are not limited to, those devices disclosed in U.S. patent application Ser. No. 10/652,449 entitled "Solid State Thermal Engine" by Tanielian, U.S. Pat. Nos. 6,774,003, 6,720,704, and 6,680,214 issued to Tavkhelidze et al., U.S. Pat. No. 6,214,651 issued to Cox, U.S. Pat. Nos. 6,089,311, 5,994,638, 5,675,972, and 5,810,980 issued to Edelson, and U.S. Pat. No. 6,651,760 issued to Cox et al., which application and issued patents are incorporated herein by reference.

A conventional figure of merit for thermoelectric devices is the ZT factor, which takes into account the thermal power, electrical conductivity, thermal conductivity and temperature of the device. For many years, the ZT factor of traditional thermoelectric devices has been on the order of 1. Recent advances by the Research Triangle Institute have improved the ZT factor of certain devices up to approximately 2.5, as disclosed, for example, in U.S. Pat. No. 6,722,140 issued to Venkatasubramanian. Although desirable improvements in the ZT factor of thermoelectric devices have been achieved, in order to make thermoelectric devices more competitive with other types of power generation and cooling systems, further improvement may be needed.

SUMMARY OF THE INVENTION

The present invention is directed to methods and apparatus for improved thermal isolation for thermo-tunneling thermoelectric devices. Embodiments of methods and systems in accordance with the present invention may advantageously improve the efficiency of the energy transfer and the ZT factor of thermoelectric devices, allowing such devices to be more competitive with other types of power generation and cooling systems.

In one embodiment, a thermoelectric device includes a first substrate having a first conductive portion, and a second substrate coupled to the first substrate and having a second conductive portion. The second conductive portion has an engagement surface positioned proximate to an engagement surface of the first conductive portion, the first and second engagement surfaces being spaced apart to define a gap. One or both of the substrates includes at least one opening positioned proximate at least a portion of an outer peripheral edge of its engagement surface. The opening may comprise a trench disposed partially or entirely around the outer peripheral edge of the engagement surface. In operation, the opening at least partially inhibits heat transfer between the first and second substrate portions by limiting conduction and convection.

BRIEF DESCRIPTION OF THE DRAWINGS

Preferred and alternate embodiments of the present invention are described in detail below with reference to the following drawings.

DETAILED DESCRIPTION

The present invention relates to methods and apparatus for improved thermal isolation for thermoelectric devices. Many specific details of certain embodiments of the invention are set forth in the following description and in FIGS. 1-10 to provide a thorough understanding of such embodiments. The present invention may have additional embodiments, or maybe practiced without one or more of the details described for any particular described embodiment.

In general, an improved thermoelectric device includes tunneling to assist in the transfer of thermal energy between a hot electrode and a cold electrode. The tunneling may, for example, be accomplished by employing thermally-driven electron tunneling. Tunneling may advantageously be used between two surfaces regardless of having any material in between them. Thus, provided that a small enough vacuum gap may be created (e.g. on the order of a 1-2 nm in size), an electron current may be generated between such surfaces while having essentially vacuum in between. Thus, the two surfaces can be electrically connected but thermally isolated. The electrons carry kinetic energy from one surface to the other, thus contributing to the electronic component of the thermal conductivity. However, since the two surfaces may not be intimately physically connected, the phonon term in the electrical conductivity may be absent. In addition, because of this thermal isolation, a relatively large $\Delta T$ may be maintained between the two surfaces, unlike that of conventional materials. Although there may be some thermal leakage around the edges of the device, in general this contribution may be reduced or kept to a minimum, as described more fully below. Thus, embodiments of such devices provide improved thermal isolation or allow a relatively larger $\Delta T$ to be maintained between the hot and cold surface in comparison with prior art devices, or both.

Figure 1:
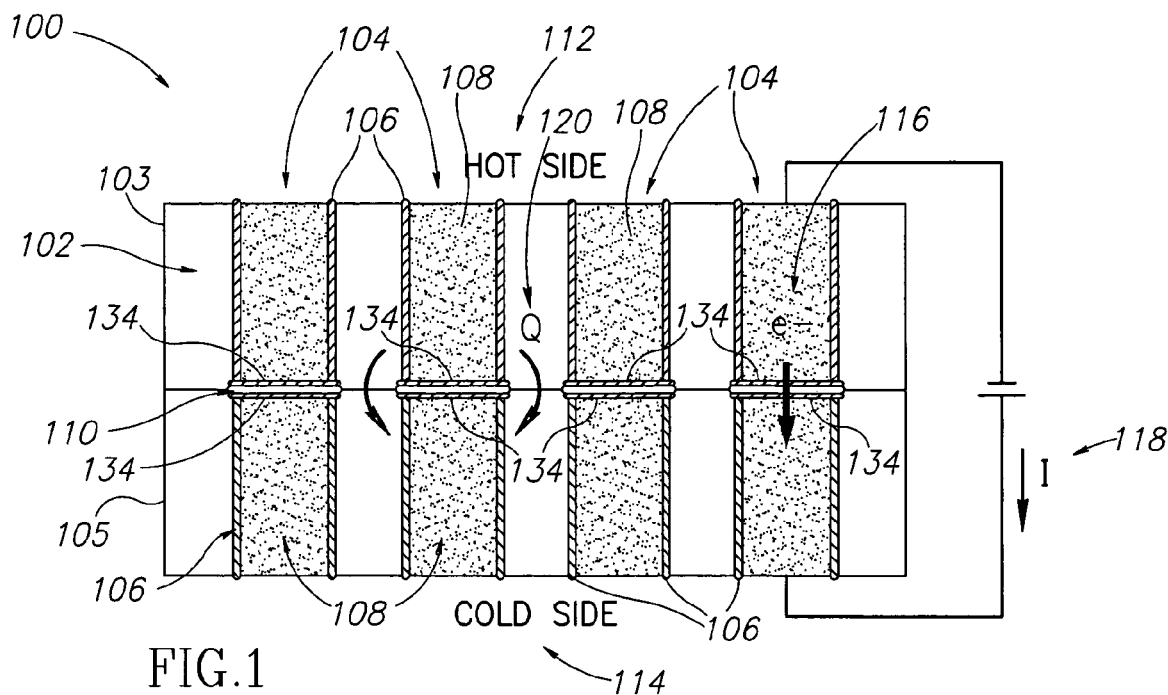
FIG. 1 is an elevational view of a thermoelectric device.

FIG. 1 is an elevational view of a thermoelectric device 100 in accordance with an embodiment of the invention. The thermoelectric device 100 includes a substrate 102 having a first portion 103 and a second portion 105. A plurality of vias 104 are formed in each of the first and second portions 103, 105, and the first and second portions 103, 105 are positioned such that each via 104 of the first portion 103 is approximately aligned with an opposing via 104 of the second portion 105. The substrate 102 may be formed of an inactive material, such as a glass or other suitable matrix material. Each via 104 has a conductive layer 106 formed on an inner surface. A conductive pad 134 spans across an end of each via 104. In one particular embodiment, the conductive layer 106 may be a sputtered copper layer. A conductive portion 108 is formed within each via 104 adjacent the conductive layer 106.

As further shown in FIG. 1, a gap 110 is formed between the first conductive layers 106 of the opposing via 104 of the first and second portions 103, 105. In some embodiments, for example, the gap 110 is on the order of one nanometer (nm) across from one conductive pad 134 to the opposing conductive pad 134. The gaps 110 may be evacuated such that a reduced pressure or an approximate vacuum exists in the gap.

Methods of forming vacuum gaps that are co-extensive with the adjacent conductive pads 134 are described in the above-referenced U.S. patent application Ser. No. 10/652,449 entitled "Solid State Thermal Engine" by Tanielian. In the embodiment shown in FIG. 1, however, the gap 110 extends beyond the outer edges of the conductive pads 134 into the first and second substrate portions 103, 105. This may be accomplished, for example, by processing of the substrate portions 103, 105 during assembly of the thermoelectric device 100, as described more fully below with respect to FIGS. 2-9.

In operation, the thermoelectric device 100 may be subjected to a temperature differential, creating a hot side (or hot electrode) 112 and a cold side (or cold electrode) 114. Electrons 116 in the hot electrode 112 have higher energy, and thus tunnel to the cold electrode 114. Of course, there is a finite probability that electrons may tunnel from the cold electrode 114 to the hot electrode 112, but on the average, more hot electrons will tunnel to the other side than cold electrons. This tunneling sets up effectively a net current 118 and creates a thermoelectric effect, which allows energy transfer to a matched load. The magnitude of the net current 118 scales directly with the temperature differential ($\Delta T$) between the hot and cold electrodes 112, 114. The higher the $\Delta T$, the more energy can be transferred between the two electrodes 112, 114. Maintenance of a large $\Delta T$ can also increase the efficiency of the energy transfer.

Although not intending to be bound by theory, the maximum possible thermal efficiency of a thermal conversion system is generally given by the Carnot efficiency $\eta_C$. The Carnot efficiency $\eta_C$ for energy transfer between two reservoirs, one at $T_1$ and one at $T_2$ is given by the following Equation (1):

$$\eta_C = \frac{T_1 - T_2}{T_1} \quad (1)$$

Thus, the closer the $\Delta T$ is between the first and second electrodes 112, 114 to the $T_1-T_2$ difference between the two reservoirs, the higher the efficiency of the energy transfer. In an actual device, however, only a fraction of the ideal Carnot efficiency $\eta_C$ may be achieved because of alternate energy paths available.

As shown in FIG. 1, one such parasitic energy transfer path is a thermal leakage 120 in the substrate 102 from the first (hot) portion 103 to the second (cold) portion 105, which in effect reduces the $\Delta T$ between the two substrate portions 103, 105. Because the gaps 110 extend outwardly beyond the edges of the conductive pads 134, the path length for the thermal leakage 120 may be increased, the area for thermal leakage may be reduced, and the thermal isolation may be improved. For example, in some embodiments of the thermoelectric device 100, the gaps 110 may effectively increase the thermal path between the hot and cold substrate portions 103, 105 by as much as a factor of 100 or more.

Figure 2:
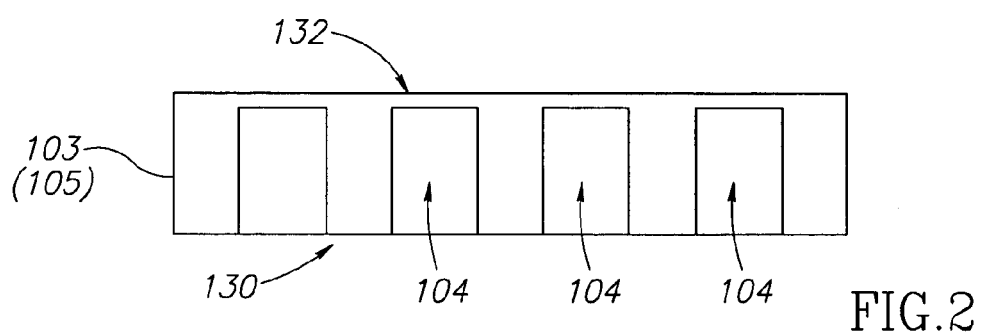
FIGS. 2 through 9 show a series of fabrication phases of the thermoelectric device of FIG. 1.

FIGS. 2 through 9 show a series of fabrication phases of the thermoelectric device 100 of FIG. 1. Unless otherwise specified, the fabrication of the thermoelectric device 100 involves conventional manufacturing processes, including photolithography. As shown in FIG. 2, the plurality of vias 104 are formed in the first portion 103 (or second portion 105) of the substrate 102. The vias 104 may, for example, be formed by etching or ultrasonic drilling the first portion 103 from a first (or back) surface 130 toward a second (or front) surface 132. Alternately, other suitable methods may be used to form the vias 104.

Figure 3:
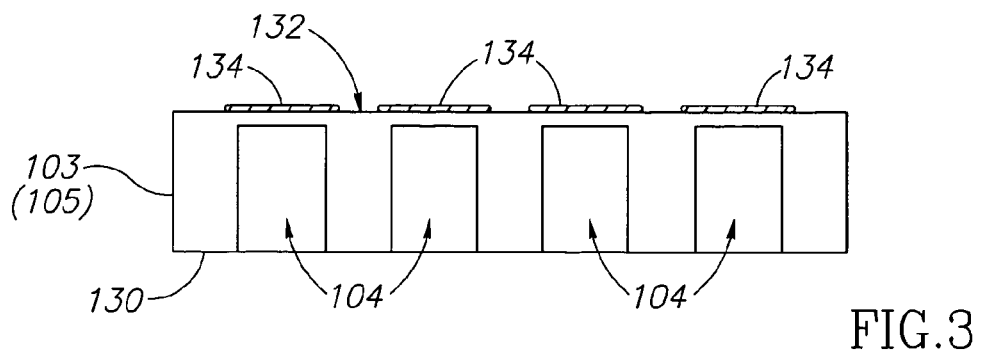

Next, as shown in FIG. 3, a thin film (or conductive pad) 134 of conductive material may be formed on the second surface 132 proximate each of the vias 104. In one particular embodiment, the thin films 134 are formed of gold (Au), and have a thickness of approximately 100 nm. The thin films 134 may be selected from a variety of thermoelectric materials and formed by vapor deposition, sputtering, or other suitable methods.

Figure 4:
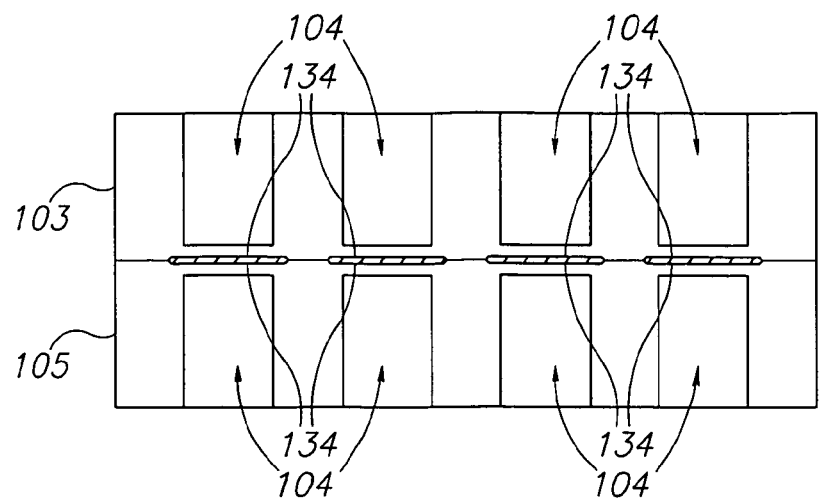

After the initial fabrication of the first and second portions 103, 105 as shown in FIGS. 1 and 2, the thin films 134 of the first and second portions 103, 105 are aligned, and the first and second portions 103, 105 are coupled together, as shown in FIG. 4. In one embodiment, for example, the wafers 103 and 105 bearing thin films 134 are bonded using a process that includes hydrophilic activation of their surfaces.

Figure 5:
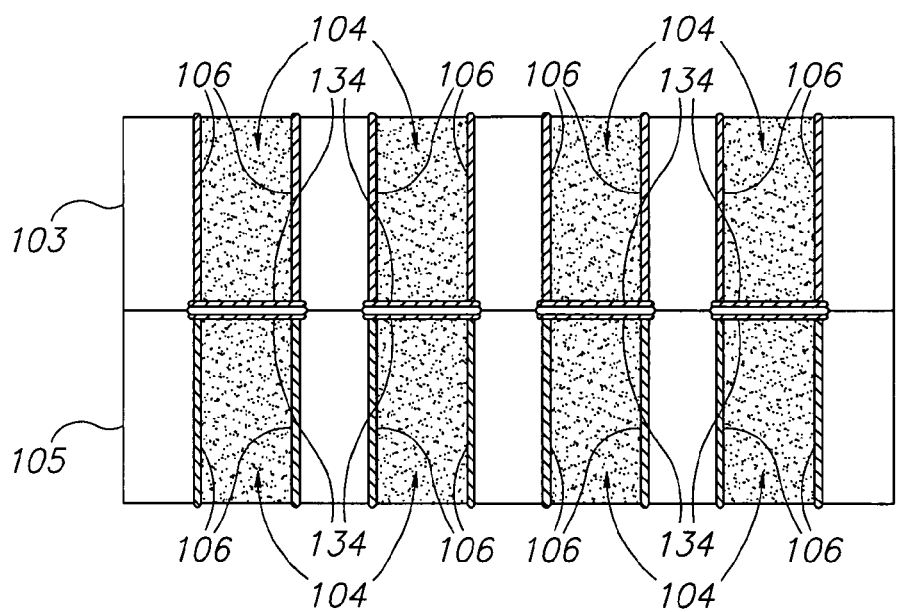
Figure 6:
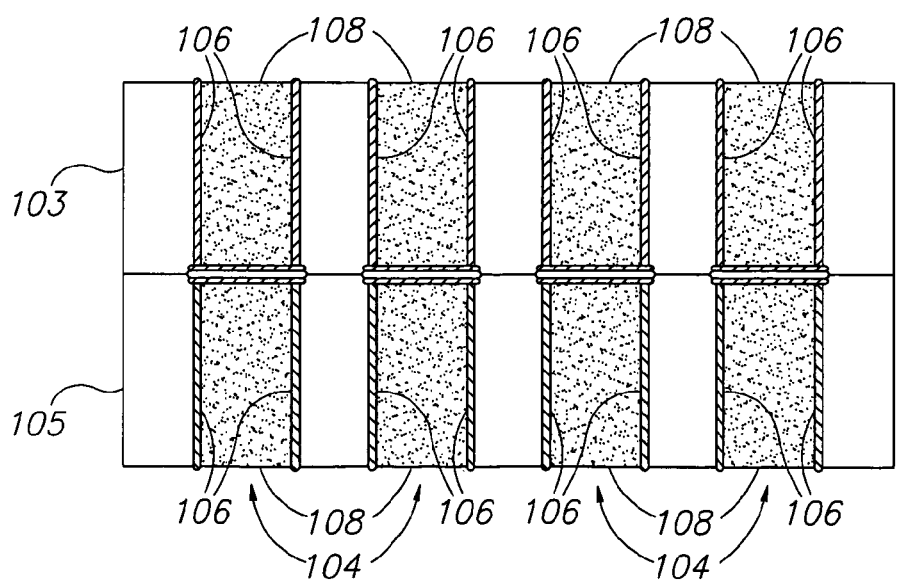

Next, as shown in FIG. 5, inner surfaces of the vias 104 of the first and second portions 103, 105 are etched so that the thin films 134 are exposed. The first conductive layers 106 are then formed on the inner surfaces of the vias 104. The conductive portions 108 are then formed in the vias 104 adjacent the first conductive layers 106, as shown in FIG. 6.

Figure 7:
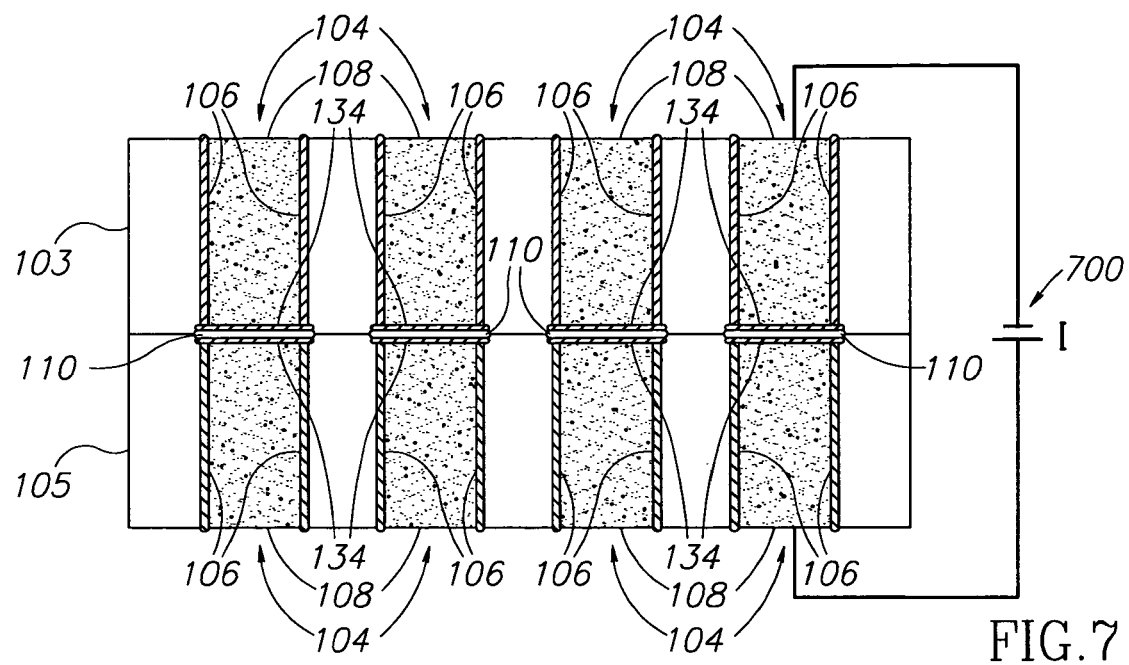

As shown in FIG. 7, a constant voltage 700 is supplied across the first and second portions 103, 105, and a current I is incremented in small steps. This process results in Joule heating and electro-migration at the interface of the thin films 134, and forms the gaps 110 between the thin films 134. When the gaps 110 are formed, the voltage 700 may rapidly increase and the current drops. For example, in one particular embodiment, the voltage 700 increases to approximately 2 V, and the current drops to the milliamp range. Methods of forming the gaps 110 are disclosed more fully, for example, in the above-referenced U.S. patent application Ser. No. 10/652,449 entitled "Solid State Thermal Engine" by Tanielian.

Figure 8:
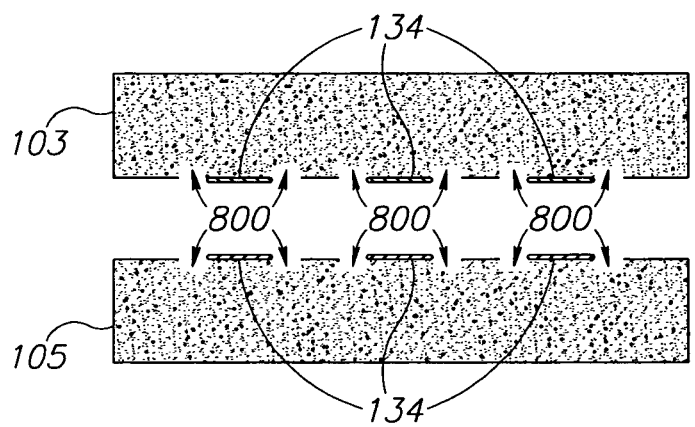
Figure 9:
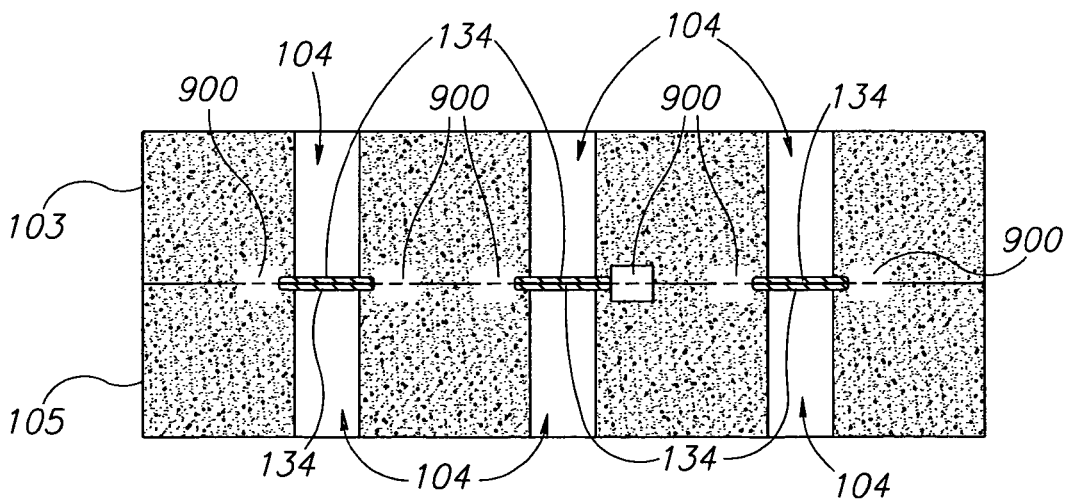

In a further embodiment of the invention, it may be desirable to create a relatively larger opening adjacent to at least a portion of the periphery of the region where the two thin films 134 meet so that thermal leakage 120 through the first and second portions 103, 105 has to go around that opening and thus have a much longer path, and consequently much lower thermal leakage 120 between the reservoirs 112 and 114 of FIG. 1. The opening may be formed in a variety of ways. For example, as shown in FIG. 8, in one embodiment, after the thin films 134 are deposited as shown in FIG. 3, a trench 800 may be formed in at least one of the first and second portions 103, 105 at least partially around a peripheral edge of each thin film 134. The trenches 800 may be formed using a conventional process, including reactive ion etching, wet chemical etching, or any other suitable process. After the first and second portions 103, 105 are aligned and the thin films 134 bonded, the opposing trenches 800 combine to form openings 900 proximate the peripheral edges of the thin films 134, as shown in FIG. 9. The openings 900 may advantageously reduce the thermal conductance 120 (FIG. 1) between the first and second portions 103, 105.

A variety of different configurations of trenches 800 and openings 900 may be conceived. For example, in one embodiment, the trenches 800 may be formed around the entire peripheral edge of the thin films 134 of both the first and second portions 103, 105. Alternately, the trenches 800 may be formed around the thin film 134 of only the first portion 103 and not the second portion 105, or vice versa. In further embodiments, the trenches 800 may not extend around the entire peripheral edge of the thin films 134, but rather, may only extend around a portion of the peripheral edge. In one particular embodiment, a pair of trenches 800 is formed on opposing lateral sides of each thin fun 134. Furthermore, the openings 900 may be approximately the same thickness as the gaps 110 formed between the conductive pads 134 (e.g. as shown in FIG. 1), or may be considerably larger than the thickness of the gaps 110 (e.g. as shown in FIGS. 8 and 9). Of course, additional alternate embodiments of trenches 800 and openings 900 may be conceived.

Figure 10:
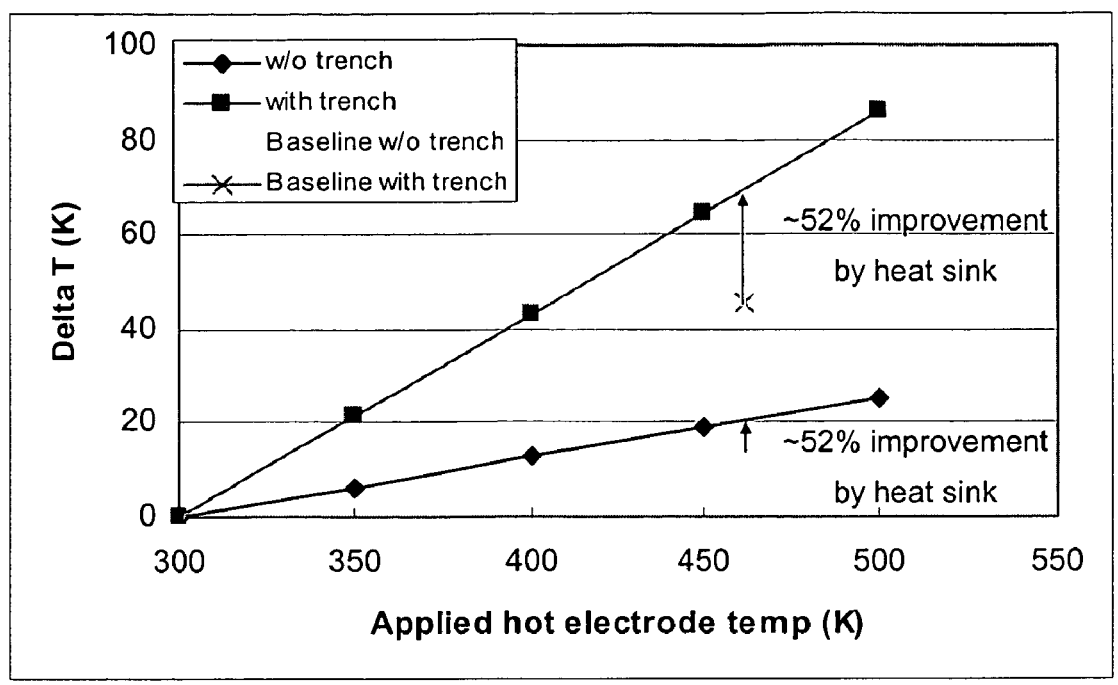
FIG. 10 shows estimated gap temperature difference versus applied temperature measured at the outer electrode.

FIG. 10 shows estimated gap temperature difference versus applied temperature measured at the outer electrode. In FIG. 10, the data designated with a triangle signifies a baseline model without any trench (i.e. without the gap 110 extending beyond the outer edge of the electrodes 108), the data designated with an "X" signifies a baseline model with a trench (i.e. with the gap 110 extending beyond the outer edge of the electrodes 108), the data designated with a diamond signifies a model without any trench but with a heat sink located on the cold side of the device 100 to improve the temperature differential across the device 100, and the data designated with a square signifies a model with a trench and with a heat sink located on the cold side of the device 100.

As can be seen from the data shown in FIG. 10, based on thermal modeling predictions, there may be a large disparity between the temperature measured by a thermocouple on the outer surface of the device 100 at the hot temperature side of the device 100 and the estimated temperature difference across the gap 110. It is desirable that most of the temperature difference between the hot and cold reservoirs on either side of the device 100 be applied across the gap 110. This may significantly improve the device performance. The data in FIG. 10 show that the presence of the trench improves the temperature difference across the gap 110 both with the heat sink present (compare squares with diamonds) and without the heat sink present (compare "X" with triangle). The temperature difference values across the gap 110 generally improve by applying a heat sink on the cold side of the device 100.

Embodiments of the present invention may provide significant advantages over the prior art. For example, because the openings 900 decrease the thermal conductance 120 between the first and second portions 103, 105, the ΔT between the first and second electrodes 112, 114 may be closer to the $T_1-T_2$ difference between the two reservoirs, thereby improving the efficiency of the energy transfer of the thermoelectric device. In turn, the ZT factor of thermoelectric devices in accordance with the present invention may be increased and may allow thermoelectric devices in accordance with the present invention to be more competitive with other types of power generation and cooling systems.

A variety of embodiments of thermoelectric devices having heat transfer inhibiting features in accordance with the present invention may be conceived. For example, heat transfer inhibiting openings may be incorporated into those thermoelectric devices disclosed, for example, in U.S. patent application Ser. No. 10/652,449 entitled "Solid State Thermal Engine" by Tanielian, U.S. Pat. Nos. 6,774,003, 6,720,704, and 6,680,214 issued to Tavkhelidze et al., U.S. Pat. No. 6,214,651 issued to Cox, U.S. Pat. Nos. 6,089,311, 5,994, 638, 5,675,972, and 5,810,980 issued to Edelson, and U.S. Pat. No. 6,651,760 issued to Cox et al. Of course, other embodiments of thermoelectric devices may also be conceived.

While preferred and alternate embodiments of the invention have been illustrated and described, as noted above, many changes can be made without departing from the spirit and scope of the invention. Accordingly, the scope of the invention is not limited by the disclosure of these preferred and alternate embodiments. Instead, the invention should be determined entirely by reference to the claims that follow.

What is claimed is:

1. A thermoelectric device, comprising:
    a first non-electrically conducting portion having a plurality of first vias, and a plurality of first conductive portions disposed within the plurality of first vias; and
    a second non-electrically conducting portion having a plurality of second vias, and a plurality of second conductive portions disposed within the plurality of second vias;
    the second non-electrically conducting portion being bonded to the first non-electrically conducting portion such that the first and second conductive portions are aligned and spaced apart to form a plurality of vacuum gaps between the first and second conductive portions, the gaps allowing thermotunneling between opposing conductive portions, wherein opposing vias are electrically connected but thermally isolated;
    wherein the first and second non-electrically conducting portions further include trenches around the entire peripheral edges of the gaps to further improve thermal isolation, and wherein adjacent vacuum gaps are laterally separated by two trenches and the bonded first and second non-electrically conducting portions.

2. The thermoelectric device of claim 1, wherein the gaps have a distance of 1-2 nanometers gap distance.

3. The thermoelectric device of claim 1, wherein the gaps have a distance on the order of 1 nanometer.

4. The thermoelectric device of claim 1, wherein a single trench is formed in the non-conductive portion for each adjacent outer peripheral edge of the plurality of the gaps.

5. The thermoelectric device of claim 1, wherein each of the first and second conductive portions comprises a conductive layer disposed within the corresponding one of the first and second via, and a conductive member formed adjacent the conductive layer.

6. A method of forming the thermoelectric device of claim 1, comprising:
    providing a first non-electrically conducting substrate having first and second opposing surfaces;
    forming a first via in the first surface of the first substrate;
    forming a first conductive pad on the second surface approximately opposite from the first via formed in the first surface;
    providing a second non-electrically conducting substrate having third and fourth opposing surfaces;
    forming a second via in the third surface of the second substrate;
    forming a second conductive pad on the fourth surface approximately opposite from the second via formed in the third surface;
    forming a trench within at least one of the second and fourth surfaces adjacent to a peripheral edge of at least one of the first and second conductive pads; and
    positioning the first and second substrates such that the first and second conductive pads are approximately aligned, wherein the trench forms an opening between the first and second substrates.

7. The method of claim 6, wherein positioning the first and second substrates includes bonding the first and second conductive pads.

8. The method of claim 6, wherein positioning the first and second substrates includes forming a gap between the first and second conductive pads.

9. The method of claim 6, further comprising evacuating the gap between the first and second conductive pads.

10. The method of claim 6, wherein forming a gap between the first and second conductive pads includes applying a voltage across the first and second conductive pads.

11. The method of claim 6, further comprising etching an inner surface of the first and second vias to expose the first and second conductive pads to an interior region of the first and second vias, respectively; and forming a conductive electrode within the first and second vias electrically coupled to the first and second conductive pads, respectively.

* * * * *